United States Patent
Ramirez

(10) Patent No.: US 11,309,727 B2
(45) Date of Patent: Apr. 19, 2022

(54) UTILITY METER WITH SOLAR-POWERED REAL-TIME CLOCK

(71) Applicant: Landis+Gyr Innovations, Inc., Alpharetta, GA (US)

(72) Inventor: Anibal Diego Ramirez, Indianapolis, IN (US)

(73) Assignee: Landis+Gyr Innovations, Inc., Alpharetta, GA (US)

( * ) Notice: Subject to any disclaimer, the term of this patent is extended or adjusted under 35 U.S.C. 154(b) by 210 days.

(21) Appl. No.: 16/830,961

(22) Filed: Mar. 26, 2020

(65) Prior Publication Data
US 2021/0305829 A1 Sep. 30, 2021

(51) Int. Cl.
| | | |
|---|---|---|
| *H02M 3/07* | (2006.01) | |
| *H02M 7/02* | (2006.01) | |
| *H02J 7/00* | (2006.01) | |
| *G01D 4/02* | (2006.01) | |
| *G06F 1/14* | (2006.01) | |
| *G06F 1/30* | (2006.01) | |
| *H02J 7/34* | (2006.01) | |

(52) U.S. Cl.
CPC .............. *H02J 7/0063* (2013.01); *G01D 4/02* (2013.01); *G06F 1/14* (2013.01); *G06F 1/305* (2013.01); *H02J 7/345* (2013.01)

(58) Field of Classification Search
CPC .. H02J 7/0063; H02J 7/345; H02J 7/35; H02J 9/061; H02J 1/10; G01D 4/02; G01D 4/00; G06F 1/14; G06F 1/305; G01R 22/06; G01R 22/066
USPC ........................................................ 307/109
See application file for complete search history.

(56) References Cited

U.S. PATENT DOCUMENTS

| | | | |
|---|---|---|---|
| 8,723,506 B2 * | 5/2014 | Ramirez ................. | H02J 7/345 324/142 |
| 10,393,415 B1 | 8/2019 | Partee et al. | |
| 10,795,933 B1 * | 10/2020 | Langley ................. | G06F 16/78 |
| 11,043,337 B2 * | 6/2021 | Hansen .................. | H01G 11/28 |
| 11,108,232 B1 * | 8/2021 | Donahue ................ | H02J 3/381 |
| 2004/0061624 A1 * | 4/2004 | Villicana ................. | H04Q 9/00 340/870.02 |

(Continued)

FOREIGN PATENT DOCUMENTS

CN 107658942 2/2018

OTHER PUBLICATIONS

International Patent Application No. PCT/US2021/020890, International Search Report and Written Opinion dated Jun. 2, 2021, 13 pages.

*Primary Examiner* — Ryan Jager
(74) *Attorney, Agent, or Firm* — Kilpatrick Townsend & Stockton LLP

(57) ABSTRACT

A utility meter includes a real-time clock (RTC), a supercapacitor, a power supply, and a set of photodiodes. The RTC keeps time utilized for time stamps applicable to events that occur during alternating current (AC) power outages of the utility meter, and the supercapacitor powers the RTC. The power supply operates in an active mode responsive to an AC line voltage meeting a threshold and, when in the active mode, charges the supercapacitor to power the RTC. The set of photodiodes absorbs energy from ambient light and charges the supercapacitor to power the RTC. Thus, the supercapacitor is configured to be charged based on the power supply and based on the set of photodiodes.

20 Claims, 8 Drawing Sheets

(56) References Cited

U.S. PATENT DOCUMENTS

| | | | |
|---|---|---|---|
| 2006/0031180 A1 | 2/2006 | Tamarkin et al. | |
| 2006/0158177 A1* | 7/2006 | Ramirez | H02J 3/14 |
| | | | 324/142 |
| 2011/0121654 A1 | 5/2011 | Recker et al. | |
| 2011/0242715 A1* | 10/2011 | Voisine | G01R 11/17 |
| | | | 361/65 |
| 2014/0005964 A1 | 1/2014 | Rouaud et al. | |
| 2019/0281259 A1* | 9/2019 | Palazzolo | H04L 9/0643 |
| 2021/0098994 A1* | 4/2021 | White | H02J 7/35 |
| 2021/0305829 A1* | 9/2021 | Ramirez | G01D 4/02 |

* cited by examiner

UTILITY METER WITH SOLAR-POWERED REAL-TIME CLOCK

TECHNICAL FIELD

Various implementations described herein relate to utility meters and, more particularly, to a utility meter with a solar-powered real-time clock.

BACKGROUND

A utility meter measures the consumption of a resource on an associated premises. To maintain its internal operations, a utility meter utilizes alternating current (AC) power provided to the utility meter. During an AC power outage at the utility meter, some critical operations of the utility meter still need to be performed. For instance, the utility meter runs a low-power real-time clock (RTC), which provides time stamps to events that occur during an AC power outage. Such events include tamper attempts and service flags, for example, each of which the utility meter associates with a time stamp based on output from the RTC.

Typically, the RTC is powered by way of direct current (DC) power provided by an internal power supply when the AC line voltage received at that power supply is sufficient. When that AC line voltage at least meets a threshold, the power supply is active and powers the RTC and, additionally, charges a supercapacitor for usage during potential AC power outages. When an AC power outage occurs (i.e., when the AC line voltage falls below the threshold), the power supply becomes inactive, and the supercapacitor powers the RTC only until the supercapacitor itself no longer has sufficient stored energy to do so. In some cases, the supercapacitor can store enough energy to power the RTC for twenty-four hours during an AC power outage. In some cases, the supercapacitor also provides power to anti-tamper sensors, such as a cover-removal sensor or a vibration sensor. In that case, the supercapacitor becomes drained of its energy even more quickly, after which the RTC and the anti-tamper sensors stop being operable.

SUMMARY

In one implementation, a utility meter includes a real-time clock (RTC), a supercapacitor, a power supply, and a set of photodiodes. The RTC keeps time utilized for time stamps applicable to events that occur during alternating current (AC) power outages of the utility meter, and the supercapacitor powers the RTC. The power supply operates in an active mode responsive to an AC line voltage meeting a threshold and, when in the active mode, charges the supercapacitor to power the RTC. The set of photodiodes absorbs energy from ambient light and charges the supercapacitor to power the RTC. Thus, the supercapacitor is configured to be charged based on the power supply and based on the set of photodiodes.

Another implementation is a method for powering an RTC of a utility meter. The method includes running, by the utility meter, an RTC configured to keep time utilized for time stamps applicable to events that occur during AC power outages of the utility meter. The method further includes charging, by a power supply of the utility meter when the power supply is active due to receiving a sufficient AC line voltage, a supercapacitor configured to power the RTC. The method further includes powering, by the supercapacitor, the RTC based on energy provided by the power supply. The method further includes charging, by a set of photodiodes, the supercapacitor based on energy absorbed from ambient light. Additionally, the method includes powering, by the supercapacitor when the power supply is inactive, the RTC based on energy provided by the photodiodes.

In yet another implementation, a method includes installing in a device an RTC configured to keep time utilized for time stamps applicable to events that occur during AC power outages of the device. The method further includes installing in the device a supercapacitor configured to power the RTC. The method further includes installing in the device a power supply configured to operate in an active mode responsive to an AC line voltage meeting a threshold and further configured, in the active mode, to charge the supercapacitor to power the RTC. Additionally, the method includes installing in the device a set of photodiodes configured to absorb energy from ambient light and configured to charge the supercapacitor to power the RTC. The supercapacitor is configured to be charged based on the power supply and based on the set of photodiodes, and the device is utilizable as a utility meter.

These illustrative aspects and features are mentioned not to limit or define the presently described subject matter, but to provide examples to aid understanding of the concepts described in this application. Other aspects, advantages, and features of the presently described subject matter will become apparent after review of the entire application.

BRIEF DESCRIPTION OF THE FIGURES

These and other features, aspects, and advantages of the present disclosure are better understood when the following Detailed Description is read with reference to the accompanying drawings.

DETAILED DESCRIPTION

Although some techniques exist to extend the time the real-time clock (RTC) can operate during an alternating current (AC) power outage, these techniques come with significant drawbacks. For instance, to extend the operation of the RTC during AC power outages, a utility meter might include a lithium battery in addition to the supercapacitor. In that case, the lithium battery is OR connected to the output of the supercapacitor, enabling both the supercapacitor and the lithium battery to be used as direct current (DC) power to the RTC. However, a lithium battery is relatively expensive, and thus, including a lithium battery in a utility meter increases the cost of manufacturing the meter. Additionally, the lithium battery requires regular service or, after several years, replacement. This results in additional cost for maintaining the utility meter. Another option would be, instead of or in addition to including a lithium battery, increasing the size (i.e., the capacitance) of the supercapacitor. However, this option is sometimes not possible due to space limitations on the printed circuit board (PCB) of the utility meter.

Some implementations described herein extend the operation of the supercapacitor to enable the supercapacitor to power the RTC for an extended period of time, for instance, for multiple days or indefinitely. Specifically, some implementations incorporate a micropower solar charger for charging the supercapacitor in a cost-effective manner. In ambient light, the micropower solar charger absorbs energy, thus enabling the micropower solar charger to charge the supercapacitor to enable the supercapacitor to continue powering the RTC. Through incorporation of the micropower solar charger, also referred to herein as a solar charger, the utility meter can exclude a lithium battery for powering the RTC. In some implementations, when ambient light is available, the solar charger absorbs energy to charge the supercapacitor while the supercapacitor powers the RTC; when ambient light is not available, the supercapacitor utilizes its stored charge to continue powering the RTC. Additionally or alternatively, the supercapacitor may power one or more sensors, such as anti-tamper sensors, for an extended period along with powering the RTC.

Figure 1:
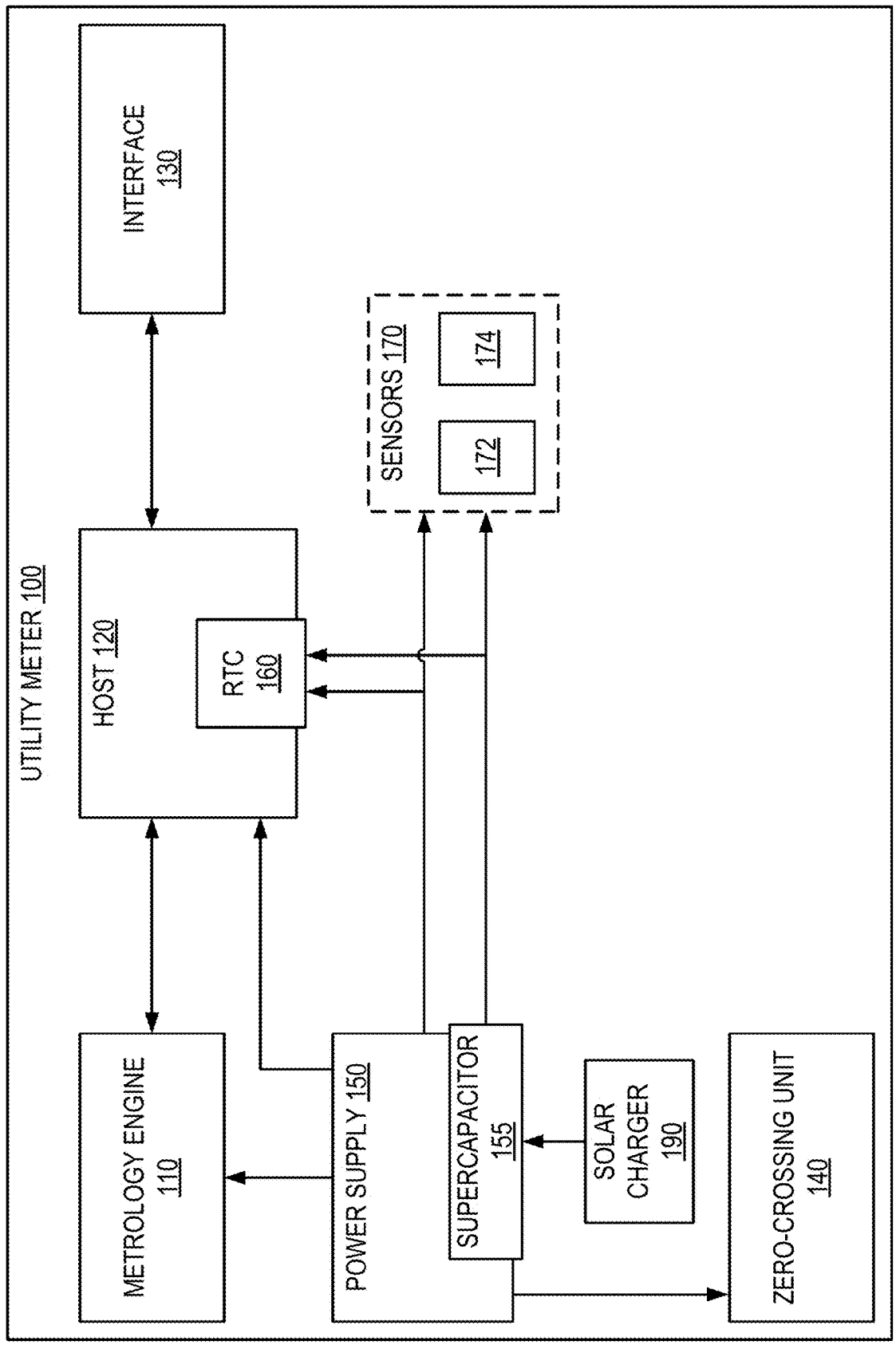
FIG. 1 is a diagram of various subsystems of a utility meter, according to some implementations described herein.

FIG. 1 is a diagram of various subsystems of a utility meter 100, also referred to as a meter 100, according to some implementations described herein. The example utility meter 100 shown in FIG. 1 is an electricity meter; however, it will be understood that implementations described herein are not limited to electricity meters and can be another type of meter that utilizes AC power. Generally, the utility meter 100 measures consumption of a resource, such as electricity, associated with a premises.

As shown in FIG. 1, the utility meter 100 includes various subsystems that operate together to form the utility meter 100. For instance, the utility meter 100 may include one or more of the following subsystems shown: a metrology engine 110, a host 120, an interface 130, a zero-crossing unit 140, sensors 170, and a power supply 150. Each subsystem may act a functional block; it will be understood that the division of operations into subsystems is for illustrative purposes only and that various subsystems, or components of subsystems, can be combined or divided in a manner other than that shown in FIG. 1 or described herein. Each of the subsystems of the utility meter 100 may be implemented as hardware, software, or a combination of both. For instance, each subsystem may be implemented as an integrated circuit, as a software function, or as some combination of hardware and software.

In some implementations, the metrology engine 110 measures consumption of a resource and generates consumption data indicating that consumption. For instance, in the case of an electricity meter such as that shown in FIG. 1, the metrology engine 110 processes samples from an AC line voltage and from current sensors and thereby computes active energy, reactive energy, power outages, and other related AC service information. In some implementations, the metrology engine 110 is implemented as an integrated circuit.

In some implementations, the host 120 processes data, such as consumption data, received from the metrology engine 110 and interfaces with automatic meter reading (AMR) devices and other peripherals, such as through the interface 130. The host 120 may be in communication with flash memory, which acts as nonvolatile mass memory for the utility meter 100. Additionally or alternatively, the host 120 may be in communication with a general user interface (GUI), which acts as a user interface to enable a user (e.g., a technician) to communicate with the utility meter 100. In some implementations, the host 120 includes an RTC 160, which keeps time utilized by the host 120 or other subsystems to apply time stamps to events. The host 120 may be implemented as a microcontroller. However, in some implementations, both the host 120 and the metrology engine 110 are implemented as a common integrated circuit; for instance, this may be the case in a utility meter 100 for residential use.

In some implementations, the interface 130 provides logic and buffering required by one or more peripherals. Such peripherals can include, for instance, the AMR, a radio, a Wireless Fidelity (WiFi) card, a Bluetooth card, an Ethernet card, or an isolated load control system. In other words, the interface 130 facilitates communications between the host 120 and one or more peripherals.

Additionally or alternatively, in some implementations, the zero-crossing unit 140 provides AC line detection. In one implementation, alternating current received at the utility meter 100 includes a single phase, and in that case, the zero-crossing unit 140 may include a single zero-crossing circuit to detect the presence of the alternating current. In another implementation, the alternating current received includes multiple phases (e.g., three phases), and in that case, the zero-crossing unit 140 may include a respective zero-crossing circuit for each phase, such that each zero-crossing circuit detects the alternating current corresponding to its respective phase. In an example implementation, the zero-crossing unit 140 is integrated with the metrology engine 110, rather than being implemented as a distinct circuit or distinct circuits.

The power supply 150 may receive an AC line voltage and, in turn, may provide DC power to various components of the utility meter 100. In some implementations, at a given time, the power supply 150 is either in active mode (i.e., is active) or in inactive mode (i.e., is inactive). Specifically, for instance, the power supply 150 is active when the AC line voltage meets (i.e., equals or exceeds) a threshold and is thus sufficient to enable the power supply 150 to generate the DC voltages needed by the various subsystems and other components of the utility meter 100. As shown in FIG. 1, for instance, the power supply 150 provides voltage to the other subsystems, including the metrology engine 110, the host 120, the interface 130, and the zero-crossing unit 140. The power supply 150 may also provide voltage to charge the supercapacitor 155 and to power the RTC 160. Additionally or alternatively, the power supply 150 provides voltage to power one or more sensors 170, which may be low-power anti-tamper sensors such as a cover-removal sensor 172 and a vibration sensor 174.

In some implementations, in the case of an AC power outage, the supercapacitor 155 provides DC voltage (e.g., 3.3 volts) to the RTC 160 in the host 120 and may also provide DC voltage to the sensors 170. However, in some implementations, to ensure that the supercapacitor 155 is able to power the RTC 160 for an extended period, the supercapacitor 155 may power the RTC 160 and not the sensors 170 during an AC power outage, thus allowing the sensors to power down. Although this disclosure refers repeatedly to the supercapacitor 155 powering the RTC 160 during an AC power outage, it will be understood that the supercapacitor 155 may also power the sensors 170 during the power outage. In other words, when the power supply 150 is inactive, the supercapacitor takes over the role of powering the RTC 160 and, in some implementations, also the sensors 170.

Additionally, as shown in FIG. 1, a solar charger 190 is connected to the supercapacitor 155, such that a DC voltage output from the solar charger 190 is input into the supercapacitor 155, charging the supercapacitor 155 and enabling the supercapacitor 155 to power the RTC 160 or the sensors 170, or both, when the power supply 150 is inactive. Specifically, in some implementations, a linear regulator receives DC voltage (e.g., 12 volts DC) from the power supply 150, when the power supply 150 is active, and generates appropriate voltage to charge the supercapacitor 155 and to power the RTC 160 and the sensors 170. Output from the solar charger 190 may be OR connected with output of the linear regulator, where the output from the OR connection is input into the supercapacitor 155, thereby enabling the supercapacitor 155 to charge based on the power supply 150 or based on the solar charger 190.

In existing utility meters that do not incorporate such a solar charger 190, an output from a lithium battery is OR connected to the output of the linear regulator to charge the supercapacitor 155. However, as discussed above, this approach requires regular service and replacement of the lithium battery. According to some implementations described herein, however, the solar charger 190 is used instead of the lithium battery. The solar charger 190 can have a longer lifespan, can require less service, and can enable the supercapacitor 155 to power devices, such as the RTC 160 or the sensors 170, for a period of time longer than can the lithium battery during an AC power outage.

Figure 2:
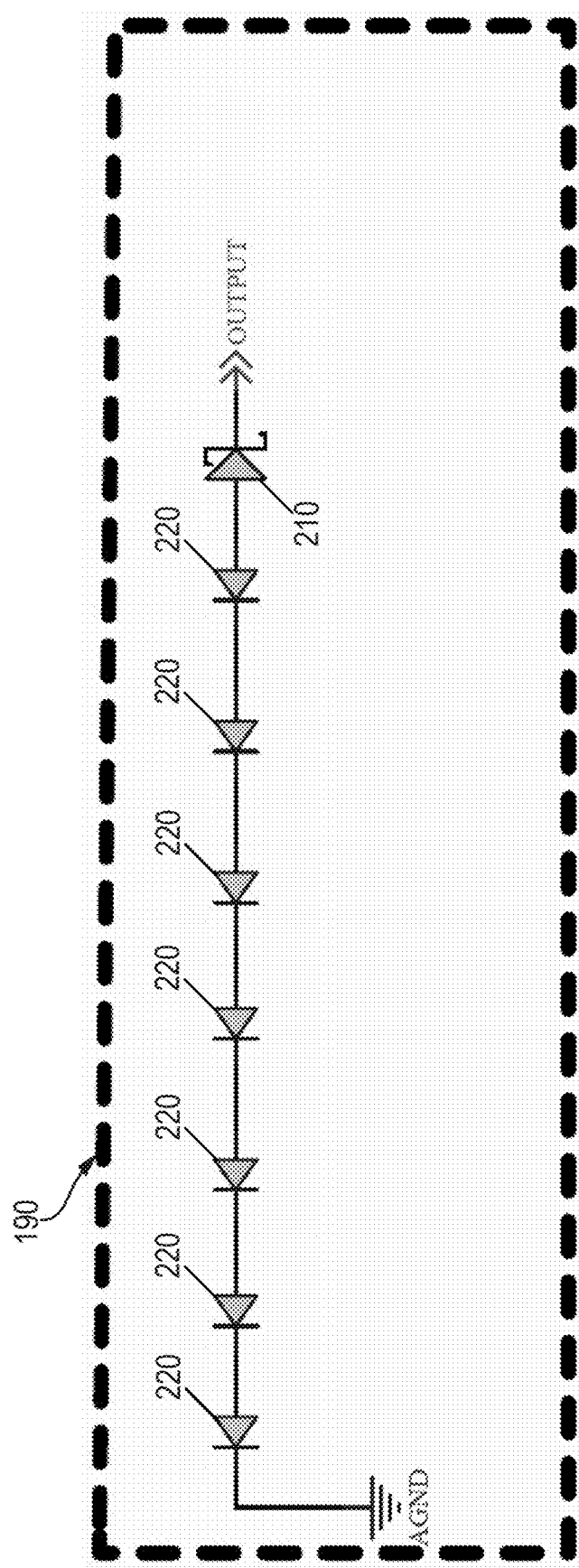
FIG. 2 is a diagram of a solar charger of the utility meter, according to some implementations described herein.

FIG. 2 is a diagram of an example of the solar charger 190 usable in a utility meter 100, according to some implementations described herein. In some implementations, the solar charger 190 is implemented as an integrated circuit, but it will be understood that other implementations are within the scope of this disclosure. As shown, the solar charger 190 may include a Schottky diode 210 as well as one or more photodiodes 220. In some implementations, the Schottky diode 210 has low leakage and low voltage forward (i.e., low voltage drop); however, the Schottky diode 210 may be replaced with another diode having low leakage and low voltage forward. The solar charger 190 may include multiple photodiodes 220, which may be connected in series such that the photodiodes 220 are additive. In some implementations, the photodiodes 220 operate in their solar cell modes. Specifically, the photodiodes 220 absorb energy when in the presence of ambient light and use that energy to output voltage to charge the supercapacitor 155.

As shown in FIG. 2, an example of the solar charger 190 includes seven photodiodes 220 in series connected to the Schottky diode 210, which connects to a supercapacitor charger to charge the supercapacitor 155. In this example, each photodiode 220 generates 400 millivolts, and thus, the seven photodiodes 220 together generate 2.8 volts, which is appropriate for charging the supercapacitor 155. The Schottky diode 210 may provide only a small voltage drop (e.g., voltage forward of 0.21 volts DC) with an acceptable level of leakage current (e.g., less than 1 µA DC). In some implementations, low leakage current is needed so that the solar charger 190 does not pull charge from the supercapacitor 155. One or more additional photodiodes 220 may be added to increase the voltage output of the solar charger 190 to the supercapacitor 155 based on the requirements of the supercapacitor 155 used or so as to charge the supercapacitor 155 more quickly.

During an AC power outage, in the absence of ambient light (e.g., at nighttime), the supercapacitor 155 powers the RTC 160 based on its stored charge that was obtained from the power supply 150 or from the photodiodes 220 during earlier ambient light. In some implementations, the supercapacitor 155 is dimensioned to be able to sustain operation of powered devices (e.g., the RTC 160 and the sensors 170) for twenty-four hours. During an AC power outage, the supercapacitor 155 recharges via the solar charger 190 in ambient light while also powering the RTC 160. When ambient light is unavailable, the supercapacitor 155 can then power the RTC until ambient light is again available. Thus, the photodiodes 220 and supercapacitor 155 may form a cycle in which, during ambient light (e.g., daylight), the supercapacitor 155 is charged based on the photodiodes 220 and powers the RTC 160 and, during darkness, the supercapacitor 155 uses its stored energy to power the RTC 160. In some implementations, this cycle can continue indefinitely during an extended AC power outage. For instance, the RTC 160 or the sensors 170, or both, can continue to operate for days, weeks, or months when powered by the supercapacitor 155.

It will be understood that various implementations operate as described herein when the utility meter 100 is placed in a location such that the utility meter 100 has access to ambient light. For instance, if the utility meter is installed in a lightless, windowless basement, then the photodiodes 220 are unable to absorb energy to output voltage to the supercapacitor 155. However, if ambient light is available, then the supercapacitor 155 may continue to power the RTC or the sensors 170 for an extended period.

Figure 3:
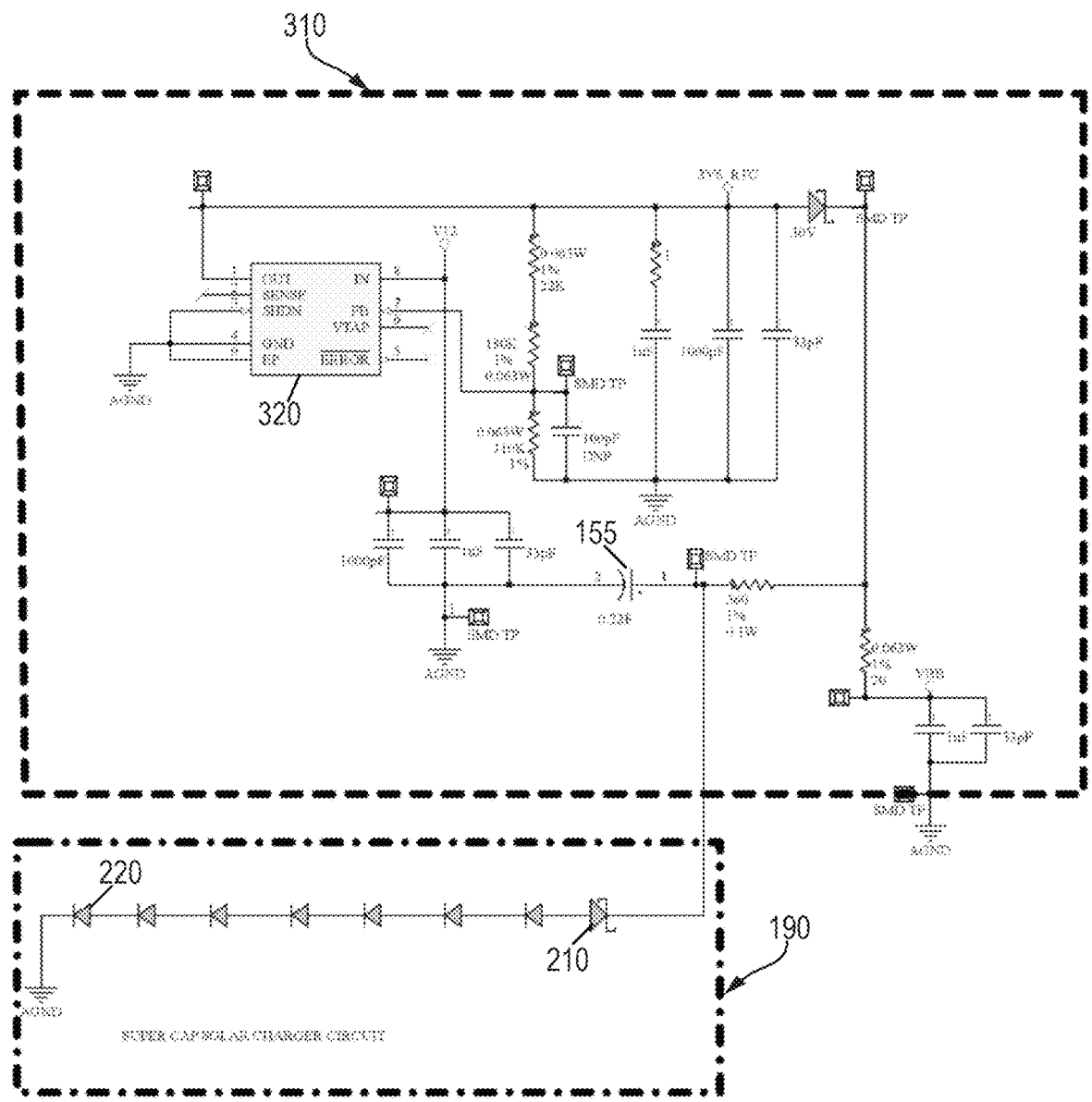
FIG. 3 is a diagram of the solar charger as connected to a supercapacitor charger configured to charge a supercapacitor, according to some implementations described herein.

FIG. 3 is a diagram of an example of the solar charger 190 as connected to a supercapacitor charger 310, which may be implemented as a supercapacitor charging circuit, according to some implementations described herein. The supercapacitor charger 310 may be part of the power supply 150, for instance, and may charge the supercapacitor 155 and power the RTC 160 and the sensors 170. The supercapacitor charger 310 includes a linear regulator 320, which, as described above, receives DC power from the power supply 150 when the power supply 150 is active and generates an appropriate voltage to charge the supercapacitor 155 and to power the RTC 160 and the sensors 170. Specifically, for instance, the linear regulator 320 has an input connected to the power supply 150 and an output connected to the supercapacitor charger 310, the RTC 160, and the sensors 170. In FIG. 3, the voltage from the power supply 150 to the linear regulator 310 is labeled V12, and the voltage from the linear regulator 310 to the RTC 160 and the sensors 170 is labeled VBB.

As shown in FIG. 3, output from the solar charger 190 may be connected (e.g., OR connected) to output from the linear regulator 320 to charge the supercapacitor 155. Thus, the supercapacitor 155 receives voltage from the power supply 150 by way of the linear regulator 310 when the power supply 150 is active due to the AC line voltage being sufficient, and the supercapacitor 155 receives voltage from the solar charger 190 when ambient light reaches the solar charger 190.

Figure 4:
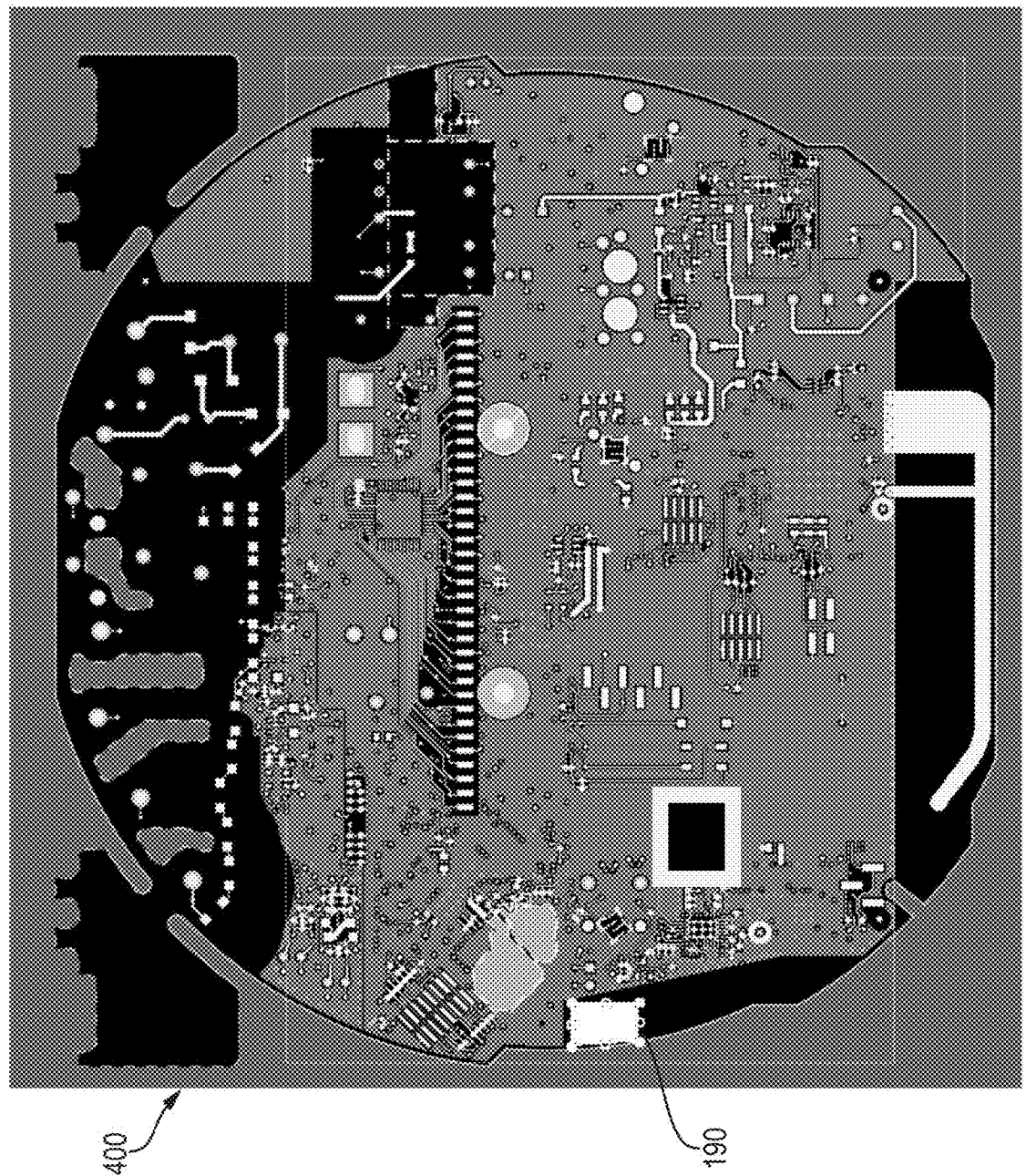
FIG. 4 illustrates a printed circuit board of the utility meter, according to some implementations described herein.

FIG. 4 illustrates a printed circuit board 400 of the utility meter 100, according to some implementations described herein. In some implementations, the various subsystems of the utility meter 100 reside on the PCB 400, which electrically connects the various subsystems as needed for operation of the utility meter 100. As shown in FIG. 4, the solar charger 190 may be mounted on the side of the PCB 400 that faces a cover, or housing, of the utility meter 100. For instance, this could be a solder side of the PCB 400 and, specifically, the solder side of a metrology electronic assembly that acts as the metrology engine 110.

Figure 5:
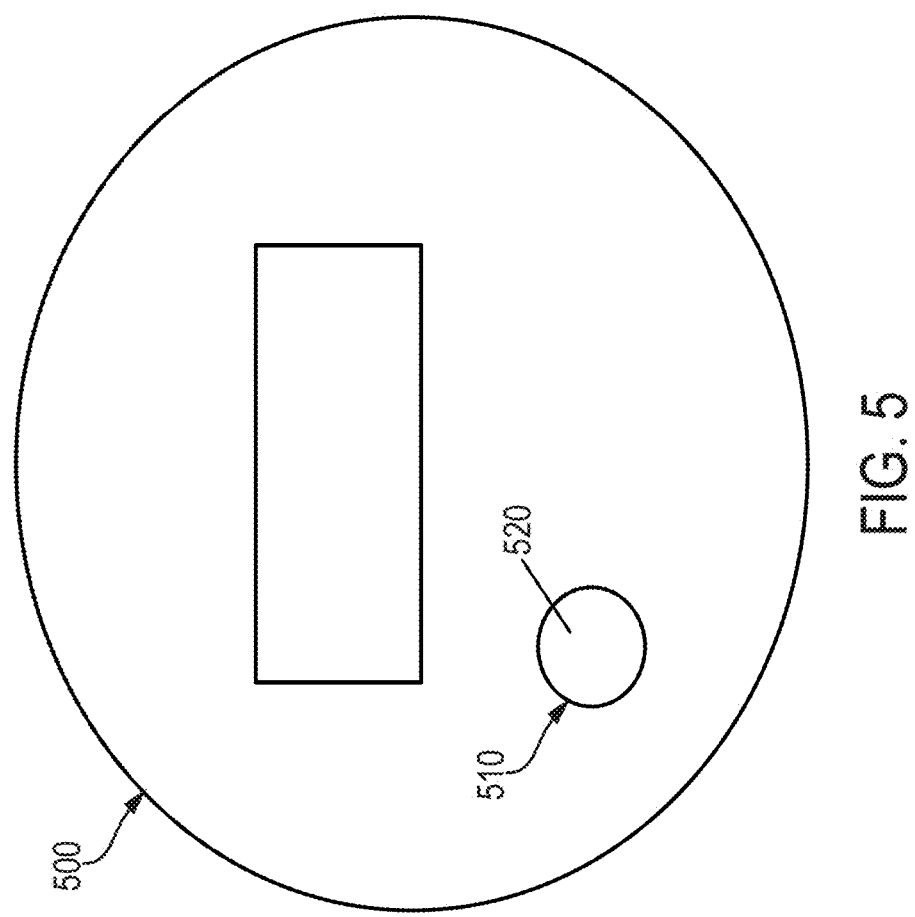
FIG. 5 illustrates a cover of the utility meter, according to some implementations described herein.

FIG. 5 illustrates a cover 500, or housing, of the utility meter 100, according to some implementations described herein. The cover 500 may house at least a portion of and therefore cover at least a portion of the PCB 400. For instance, the cover 500 can provide a layer of protection for the electronics of the utility meter 100. In some implementations, as shown in FIG. 5, the cover 500 defines an opening 510 that permits ambient light to come through the cover 500 and to thereby excite the photodiodes 220 of the solar charger 190. Further, in some implementations, a lens 520 fills the opening of the cover 500. The lens 520, which may be clear, has a curvature appropriate to focus ambient light on the photodiodes 220. For example, when no lens 520 is positioned in the opening 510, the photodiodes 220 may have a 300 millivolt output, but with a lens 520 focusing the ambient light, the photodiodes 220 may have an output of 500 millivolts. One skilled in the art will understand how to compute an appropriate curvature for the lens 520. Such a lens 520 can improve the efficiency of the photodiodes 220 at charging the supercapacitor 155 by enabling an increased amount of light to reach the photodiodes 220.

Figure 6:
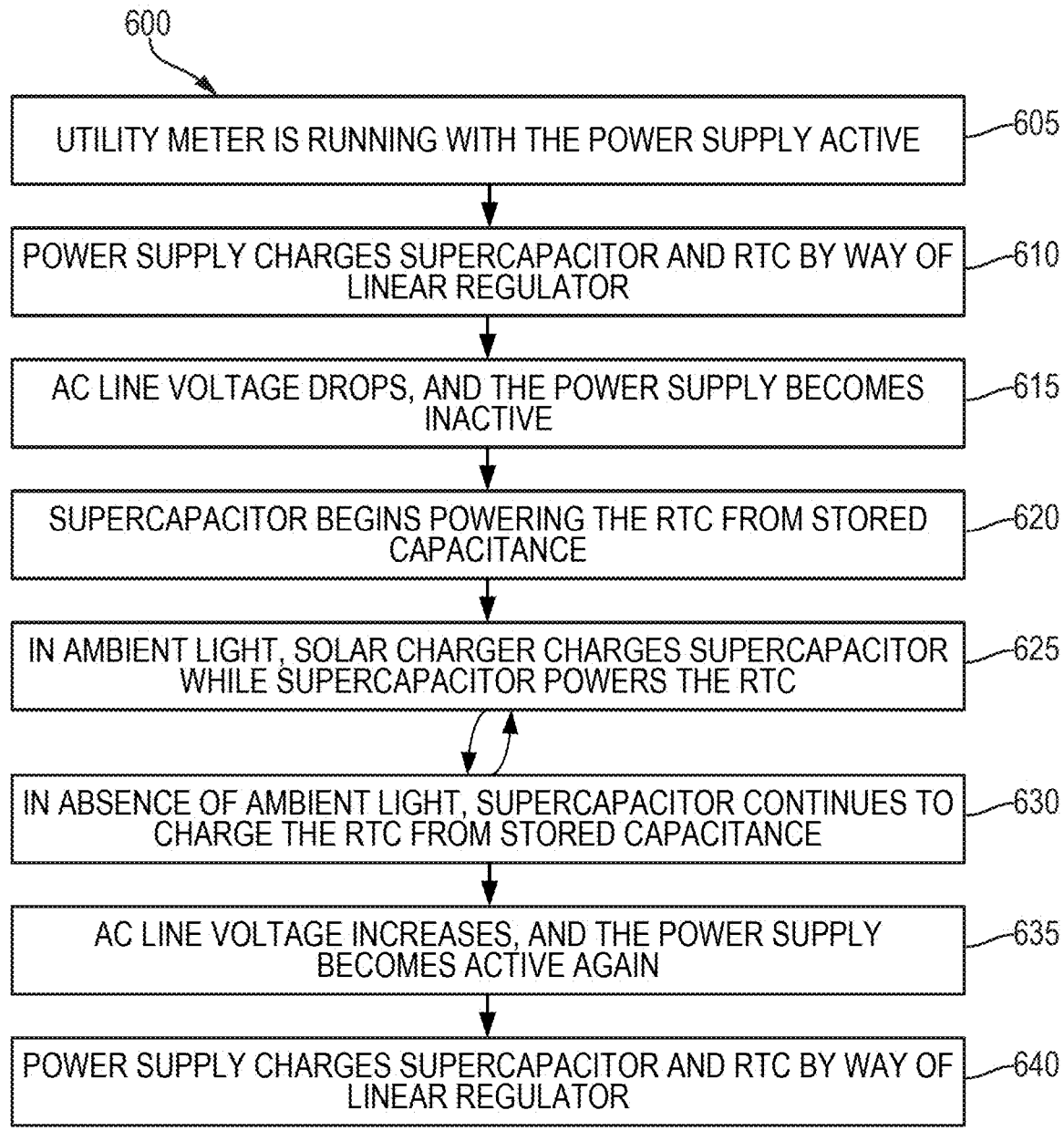
FIG. 6 is a flow diagram of a method performed in a utility meter to power a real-time clock using a solar-charged supercapacitor, according to some implementations described herein.

FIG. 6 is a flow diagram of a method 600 performed in a utility meter 100 to power an RTC 160, according to some implementations described herein. Although this method 600 refers specifically to powering the RTC 160, it will be understood that the same or a similar method could be used to power one or more sensors 170 additionally or alternatively to the RTC 160. It will additionally be understood that this method 600 is provided for illustrative purposes only and, further, that the various activities need not be performed in the order described. For instance, various activities described below as part of this method 600 can occur concurrently while the utility meter 100 is running.

At block 605, the utility meter 100 is running, and the power supply 150 of the utility meter is active. Thus, the power supply 150 delivers DC voltage to power various subsystems of the utility meter 100. At block 610, due to being active, the power supply 150 charges the supercapacitor 155 and powers the RTC 160 by way of the linear regulator 320. Although not shown in FIG. 6, while the power supply 150 is active, the solar charger 190 may still contribute to charging the supercapacitor 155. At block 615, the AC line voltage drops below a threshold, and the power supply 150 becomes inactive.

At block 620, the supercapacitor 155 begins to power the RTC 160 from stored capacitance in the supercapacitor 155. At block 625, when ambient light reaches the solar charger 190, the photodiodes 220 excite, causing the solar charger 190 to charge the supercapacitor 155, which continues to power the RTC 160. At block 630, when ambient light is no longer present, the supercapacitor 155 continues to power the RTC 160 from stored capacitance in the supercapacitor 155. As shown in FIG. 6, blocks 625 and 630 repeat in a cycle for an extended period of time, such as for a term as long as the power supply 150 is inactive.

At block 635, the AC line voltage increases to at least the threshold, causing the power supply 150 to become active again. Thus, at block 640, the power supply 150 returns to charging the supercapacitor 155 and powering the RTC 160 by way of the linear regulator 320.

Figure 7:
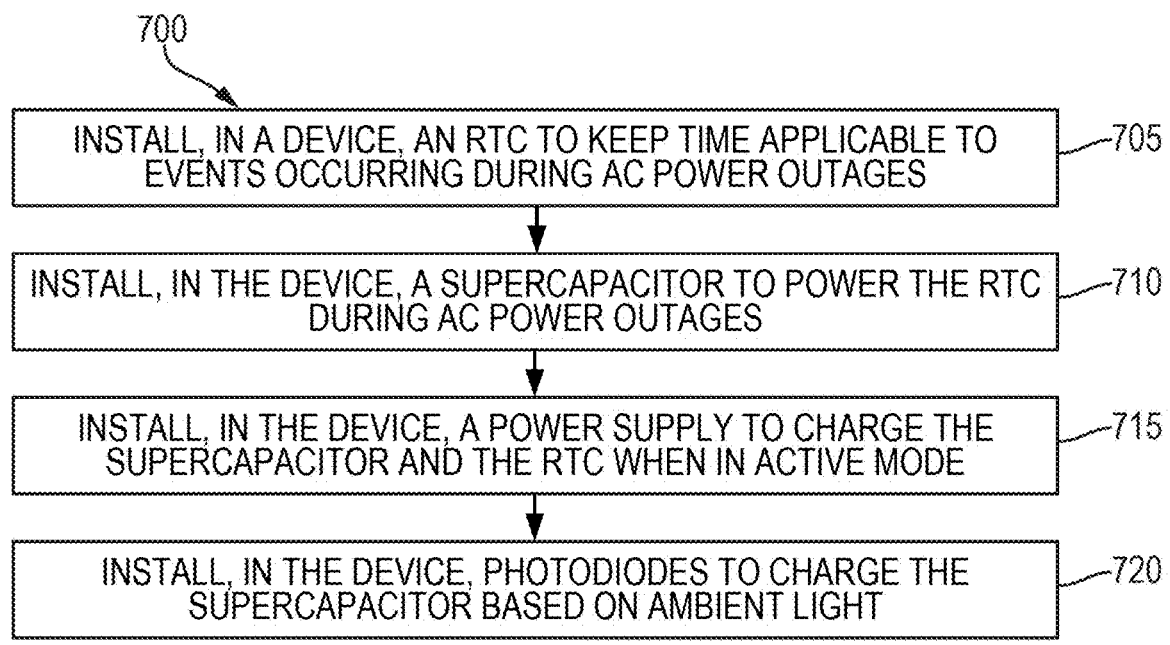
FIG. 7 is a flow diagram of a method of producing a utility meter that incorporates a solar charger to charge the supercapacitor, according to some implementations described herein.

FIG. 7 is a flow diagram of a method 700 of producing (e.g., manufacturing) a utility meter 100 that incorporates a solar charger 190 to charge the supercapacitor 155, according to some implementations described herein. This method 700 or similar may be performed by one or more people, by one or more machines, or by a combination of people and machines. It will be understood that this method 700 is provided for illustrative purposes only, that the various activities of this method 700 do not limit activities that could be performed to produce the utility meter 100, and that the various activities need not be performed in the order described.

As shown in FIG. 7, at block 705, the method 700 involves installing in a device an RTC 160 configured to keep time utilized for time stamps applicable to events that occur during AC power outages of a utility meter 100. According to this disclosure, the term "install" refers to establishing for use. The device in which the RTC 160 is installed is, or will become during or after its production, the utility meter 100. For instance, in this case, installation of the RTC 160 may include electrically connected the RTC 160 to the host 120 or to various other components of the utility meter 100.

At block 710, the method 700 involves installing in the device a supercapacitor 155 configured to power the RTC 160 during AC power outages. For instance, installation of the supercapacitor 155 may include electrically connecting an input of the supercapacitor 155 to the supercapacitor charger 310 and an output of the supercapacitor 155 to the RTC 160.

At block 715, the method 700 involves installing in the device a power supply 150 configured to operate in an active mode responsive to an AC line voltage meeting a threshold and further configured, in the active mode, to charge the supercapacitor 155 to power the RTC 160. For instance, installing the power supply 150 may include electrically connecting outputs of the power supply 150 to the supercapacitor 155, the RTC 160, and the various subsystems of the utility meter 100.

At block 720, the method 700 involves installing in the device a set of photodiodes 220 configured to absorb energy from ambient light and to charge the supercapacitor 155 to power the RTC 160. For instance, installing the photodiodes 220 may include connecting a series of photodiodes 220 to a Schottky diode 210, and connecting the Schottky diode 210 to an input of a supercapacitor charger 310. As such, in some implementations, the supercapacitor 155 is configured to be charged based on the power supply 150 and also based on the set of photodiodes 220.

Figure 8:
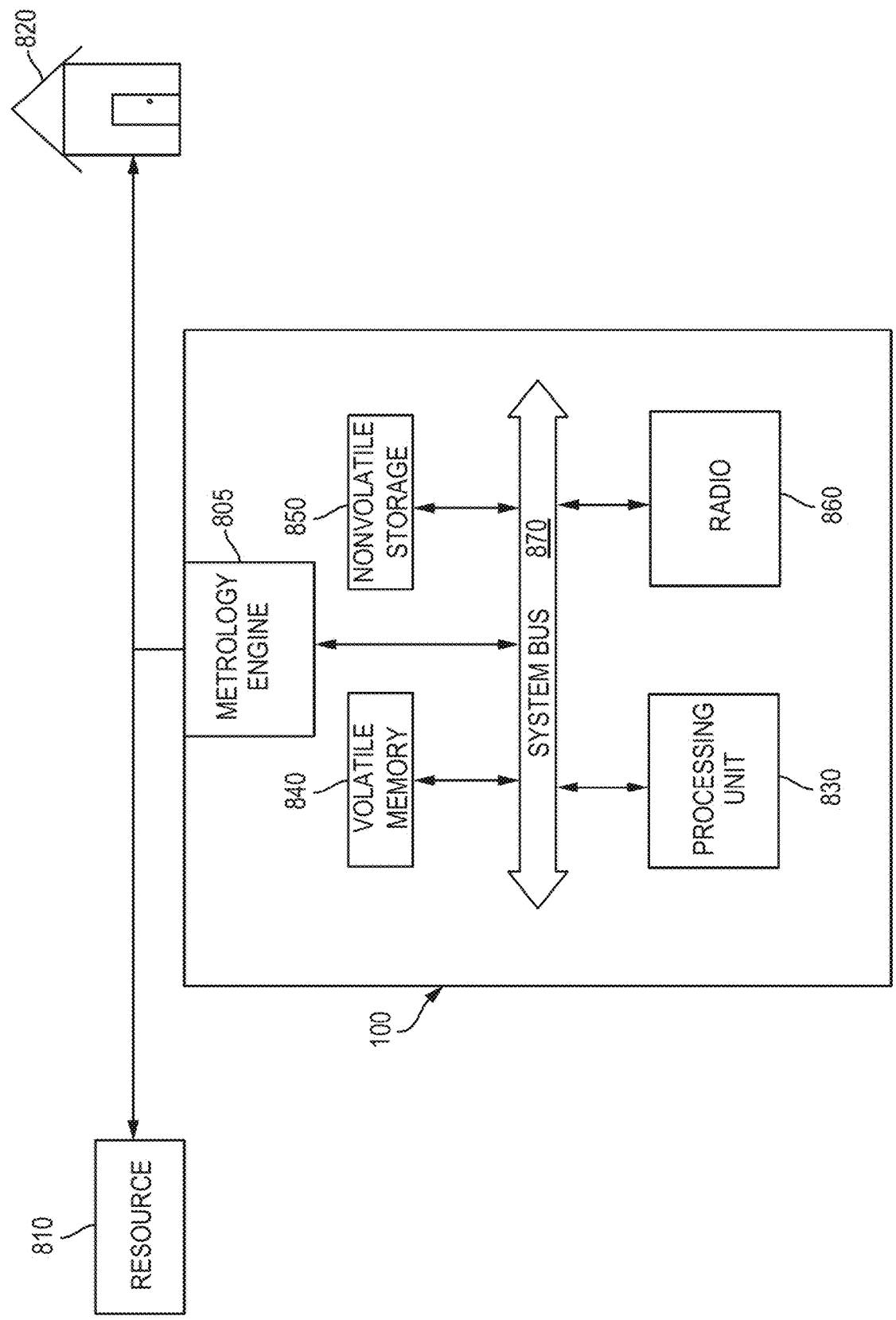
FIG. 8 is a diagram of a utility meter that can incorporate a solar charger to charge a supercapacitor, according to some implementations described herein.

FIG. 8 is a diagram of a utility meter 100, according to some implementations described herein. For instance, the utility meter 100 may be an electricity meter or another type of meter that measures consumption of a resource 810. A utility meter 100 such as that shown may include a solar charger 190 to charge a supercapacitor 155, which powers an RTC 160 or one or more sensors 170, as described herein.

As shown in FIG. 8, an example utility meter 100 measures consumption of a resource 810 occurring on a premises 820. To this end, the utility meter 100 may include a metrology engine 110, which detects a signal indicating use of the resource 810 and, based on that signal, determines use of the resource 810 on the premises 820. The utility meter 100 may further include a processing unit 830, a volatile memory 840, a nonvolatile storage 850, and a communication device such as a radio 860. The processing unit 830, the volatile memory 840, the nonvolatile storage 850, and the radio 860 may be in communication with one another and with the metrology engine 110 by way of a system bus 870. Although the processing unit 830, the volatile memory 840, and the nonvolatile storage 850 are shown and described herein as being distinct components, it will be understood that this distinction is for illustrative purposes only and does not limit the scope of this disclosure. For instance, the processing unit 830, the volatile memory 840, and the nonvolatile storage 850 may be integrated together into a single chip, such as a microcontroller that acts as all or part of the host 120 described above.

In some implementations, logical operations of the utility meter 100 are embodied as program instructions stored in a computer-readable medium, such as the nonvolatile storage 850 or the volatile memory 840 of the utility meter 100. In some implementations, the computer-readable medium is a non-transitory computer-readable medium. The processing unit 830 may execute the program instructions to implement operations as described herein. Additionally or alternatively, certain operations of the utility meter 100, such as the charging of the supercapacitor 155 by the power supply 150 or the solar charger 190, may be implemented as hardware rather than as computer-readable instructions.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

The features discussed herein are not limited to any particular hardware architecture or configuration. A computing device can include any suitable arrangement of components that provide a result conditioned on one or more inputs. Suitable computing devices include multipurpose microprocessor-based computer systems accessing stored software (i.e., computer-readable instructions stored on a memory of the computer system) that programs or configures the computing system from a general-purpose computing apparatus to a specialized computing apparatus implementing one or more aspects of the present subject matter. Any suitable programming, scripting, or other type of language or combinations of languages may be used to implement the teachings contained herein in software to be used in programming or configuring a computing device.

Aspects of the methods disclosed herein may be performed in the operation of such computing devices. The order of the blocks presented in the examples above can be varied; for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific aspects thereof, it will be appreciated that those skilled in the art, upon attaining an understanding of the foregoing, may readily produce alterations to, variations of, and equivalents to such aspects. Accordingly, it should be understood that the present disclosure has been presented for purposes of example rather than limitation and does not preclude inclusion of such modifications, variations, and/or additions to the present subject matter as would be readily apparent to one of ordinary skill in the art.

What is claimed is:

1. A utility meter comprising:
a real-time clock (RTC) configured to keep time utilized for time stamps applicable to events that occur during alternating current (AC) power outages of the utility meter;
a supercapacitor configured to power the RTC;
a power supply configured to operate in an active mode responsive to an AC line voltage meeting a threshold and further configured, in the active mode, to charge the supercapacitor to power the RTC; and
a set of photodiodes configured to absorb energy from ambient light and to charge the supercapacitor to power the RTC;
wherein the supercapacitor is configured to charge based on the power supply and based on the set of photodiodes.

2. The utility meter of claim 1, wherein the set of photodiodes comprises two or more photodiodes connected in series.

3. The utility meter of claim 2, further comprising a linear regulator connected to an output of the power supply, wherein an output of the linear regulator is connected to a supercapacitor charger to charge the supercapacitor, and wherein the set of photodiodes is connected to the supercapacitor charger to charge the supercapacitor.

4. The utility meter of claim 3, further comprising a Schottky diode connecting the set of photodiodes to the supercapacitor charger.

5. The utility meter of claim 1, further comprising a metrology electronics assembly configured to measure consumption of a resource, wherein the set of photodiodes is mounted on a side of the metrology electronic assembly on a printed circuit board of the utility meter.

6. The utility meter of claim 1, further comprising a cover over a printed circuit board of the utility meter, the cover defining an opening configured to allow the ambient light to reach the set of photodiodes.

7. The utility meter of claim 6, further comprising a lens fitted into the opening of the cover of the utility meter, the lens configured to focus light onto the set of photodiodes.

8. The utility meter of claim 1, wherein the supercapacitor is configured to power the RTC over two or more days during which the power supply is inactive.

9. The utility meter of claim 1, wherein the supercapacitor is configured to power one or more sensors while the power supply is inactive.

10. A method for powering a real-time clock (RTC) of a utility meter, the method comprising:
running, by the utility meter, an RTC configured to keep time utilized for time stamps applicable to events that occur during alternating current (AC) power outages of the utility meter;
charging, by a power supply of the utility meter when the power supply is active due to receiving a sufficient AC line voltage, a supercapacitor configured to power the RTC;
powering, by the supercapacitor, the RTC based on energy provided by the power supply;
charging, by a set of photodiodes, the supercapacitor based on energy absorbed from ambient light; and powering, by the supercapacitor when the power supply is inactive, the RTC based on energy provided by the photodiodes.

11. The method of claim 10, wherein the set of photodiodes comprises two or more photodiodes connected in series.

12. The method of claim 11, wherein the utility meter comprises a linear regulator connected to an output of the power supply, wherein an output of the linear regulator is connected to a supercapacitor charger to charge the supercapacitor, and wherein the set of photodiodes is connected to the supercapacitor charger to charge the supercapacitor.

13. The method of claim 12, wherein the utility meter comprises a Schottky diode connecting the set of photodiodes to the supercapacitor charger.

14. The method of claim 10, further comprising measuring, by a metrology electronics assembly, consumption of a resource, wherein the set of photodiodes is mounted on a side of the metrology electronic assembly on a printed circuit board of the utility meter.

15. The method of claim 10, wherein the utility meter comprises a housing covering at least a portion of a printed circuit board of the utility meter, the housing defining an opening configured to allow the ambient light to reach the set of photodiodes.

16. The method of claim 15, wherein the utility meter comprises a lens fitted into the opening of the housing, the lens configured to focus light onto the set of photodiodes.

17. The method of claim 10, wherein the supercapacitor is configured to power the RTC over two or more days during which the power supply is inactive.

18. A method comprising:
   installing in a device a real-time clock (RTC) configured to keep time utilized for time stamps applicable to events that occur during alternating current (AC) power outages of the device;
   installing in the device a supercapacitor configured to power the RTC;
   installing in the device a power supply configured to operate in an active mode responsive to an AC line voltage meeting a threshold and further configured, in the active mode, to charge the supercapacitor to power the RTC; and
   installing in the device a set of photodiodes configured to absorb energy from ambient light and to charge the supercapacitor to power the RTC;
   wherein the supercapacitor is configured to charge based on the power supply and based on the set of photodiodes; and
   wherein the device is utilizable as a utility meter.

19. The method of claim 18, further comprising:
   connecting an input of a linear regulator to an output of the power supply;
   connecting an output of the linear regulator to an input of a supercapacitor charger to charge the supercapacitor; and
   utilizing a Schottky diode to connect the set of photodiodes to the supercapacitor charger to charge the supercapacitor.

20. The method of claim 18, further comprising:
   mounting the set of photodiodes on a side of a metrology electronics assembly on a printed circuit board of the device;
   fitting a lens into a housing of the device; and
   installing the housing with the lens over the side of the metrology electronics assembly on the printed circuit board.

* * * * *